(12) United States Patent
Takahashi (10) Patent No.: US 7,868,359 B2
(45) Date of Patent: Jan. 11, 2011

(54) SEMICONDUCTOR DEVICE

(75) Inventor: Toshifumi Takahashi, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 92 days.

(21) Appl. No.: 12/071,124

(22) Filed: Feb. 15, 2008

(65) Prior Publication Data

US 2008/0217704 A1    Sep. 11, 2008

(30) Foreign Application Priority Data

Mar. 7, 2007    (JP) ............................. 2007-057119

(51) Int. Cl.
  *H01L 27/088*    (2006.01)
(52) U.S. Cl. .................. 257/204; 257/206; 257/499; 257/397
(58) Field of Classification Search ......... 257/202–211, 257/240, 286, 397, 499, E27.06
See application file for complete search history.

(56) References Cited

U.S. PATENT DOCUMENTS

| | | | | |
|---|---|---|---|---|
| 6,320,223 B1* | 11/2001 | Hueting et al. | ............... | 257/341 |
| 6,531,357 B2* | 3/2003 | Takeuchi et al. | ............ | 438/241 |
| 6,891,761 B2* | 5/2005 | Kumagai et al. | ............ | 257/206 |
| 6,924,560 B2* | 8/2005 | Wang et al. | .................... | 257/67 |
| 7,032,194 B1* | 4/2006 | Hsueh et al. | ................... | 716/4 |
| 7,093,215 B2* | 8/2006 | Sahara et al. | ................... | 716/4 |
| 7,109,568 B2* | 9/2006 | Kumagai et al. | ............ | 257/627 |
| 7,205,617 B2* | 4/2007 | Ohta et al. | ................... | 257/374 |
| 2006/0145266 A1* | 7/2006 | Zushi et al. | ................. | 257/369 |
| 2007/0007617 A1* | 1/2007 | Nakamura et al. | .......... | 257/503 |
| 2007/0164317 A1* | 7/2007 | Nakanishi | .................... | 257/206 |

FOREIGN PATENT DOCUMENTS

| | | |
|---|---|---|
| JP | 2002-76148 | 3/2002 |
| JP | 2005-101453 | 4/2005 |
| JP | 2006-190727 | 7/2006 |

\* cited by examiner

*Primary Examiner*—Leonardo Andújar
*Assistant Examiner*—Jordan Klein
(74) *Attorney, Agent, or Firm*—McGinn IP Law Group, PLLC (57) ABSTRACT

In a semiconductor device including multiple unit cells arranged in an array, transistors are affected by a stress from an STI at different degrees depending on the position in the array. As a result, a variation occurs in transistor characteristic. In a semiconductor device according to the present invention, each of predetermined transistors in outermost unit blocks in the array has a transistor size according to the stress from the STI.

16 Claims, 8 Drawing Sheets

SEMICONDUCTOR DEVICE

BACKGROUND OF THE INVENTION

1. Field of the Invention

The present invention relates to a semiconductor integrated circuit including an MOS transistor, in particular, to a technique effectively applied to a layout structure in consideration of a transistor characteristic varying depending on a stress-strain applied by a shallow trench isolation (STI).

2. Description of the Related Art

With the recent miniaturization of a transistor, an STI structure has been widely used as a technique of isolating MOS transistors from each other. In a CMOS device fabricated by a refined process, a phenomenon that the MOS transistor demonstrates a variation in a threshold voltage, current drivability, and the like under a stress applied by the STI has been confirmed. In particular, for the CMOS device including a plurality of transistors in a predetermined region surrounded by the STI, the stress applied by the STI is varied for each of the plurality of transistors depending on the position of the transistor in the predetermined region. More specifically, because a diffusion area, a gate, or the like has an irregular pattern in an end area of the predetermined region, the transistor is more remarkably affected by the stress from the STI as compared with that in a central area. With an increase in the degree of integration and miniaturization, less suppression of the variation is requested.

The relation between the STI structure and the transistor characteristic is described in, for example, the following patent publications.

First, Japanese Patent Application Laid-open No. 2006-190727 (hereinafter, referred to as Patent Document 1) describes a variation in effect of a stress generated in an STI structure on each of a P-channel transistor and an N-channel transistor. The stress is applied by the STI to a device active region in a compression direction. As a result, an electron mobility decreases, whereas a hole mobility increases. In view of the problem, Patent Document 1 discloses that full (100%) transistor performance (Ids characteristic) can be obtained by increasing a distance from a device isolation region to a channel region in a gate length direction in the N-channel transistor.

Japanese Patent Application Laid-open No. 2005-101453 (hereinafter, referred to as Patent Document 2) discloses a semiconductor device including an extra dummy cell region provided in an outer peripheral area of a memory cell array so as to absorb a variation in processing size of the other cells.

Furthermore, Japanese Patent Application Laid-open No. 2002-76148 (hereinafter, referred to as Patent Document 3) discloses a technique of reducing a variation in size of a memory cell array in a non-volatile memory in the following manner. A width of a device isolation region and an interval between floating gates are increased only in a boundary area between an end area of a memory cell array and an inner area of the memory cell array. In addition, a width of a device region is increased only in the end area of the memory cell array.

Figure 8:
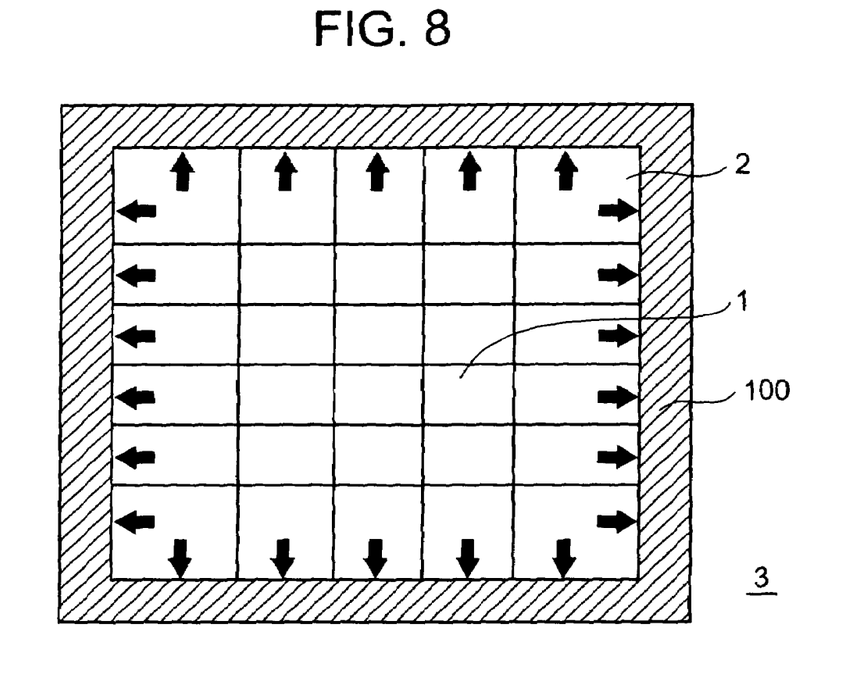
FIG. 8 is a diagram illustrating a memory array according to a first conventional example.
Figure 9:
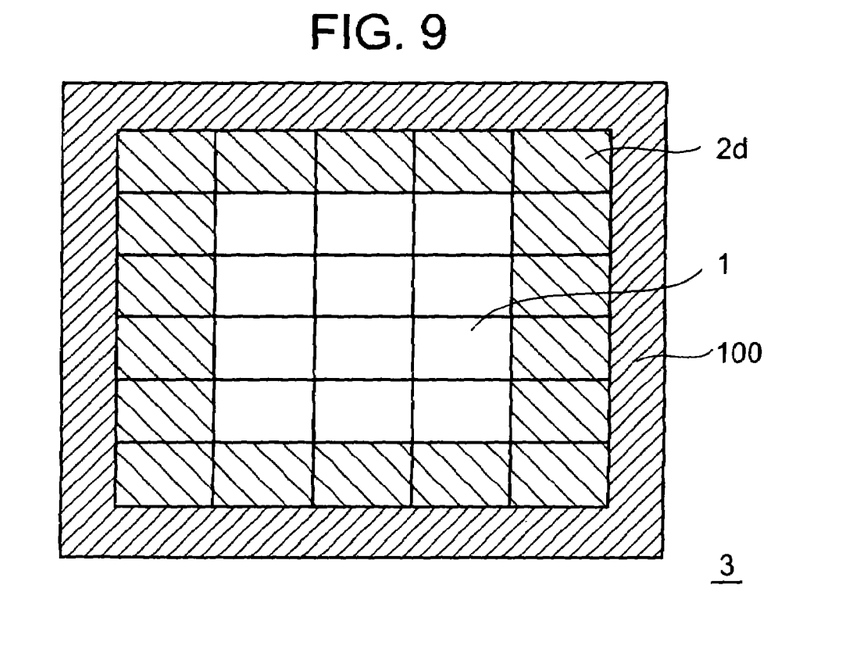
FIG. 9 is a diagram illustrating a memory array according to a second conventional example.

The above description is summarized as follows. According to Patent Documents 1 and 3, an area of each of outermost cells 2 is increased in directions as indicated with arrows as compared with an inner cell 1 in an array 3, as illustrated in FIG. 8. According to Patent Document 2, an invalid area 2d is required as illustrated in FIG. 9. In other words, in all the Patent Documents 1 to 3 described above, a variation in transistor characteristic of the whole array is reduced at the sacrifice of the area of the outermost cells 2 or 2d. Herein, a unit cell is a single cell transistor or a region of a minimum unit circuit to be repeated. For example, in the case of an SRAM memory, six transistors form a single cell. The unit cell, which includes the transistors constituting the cell and a margin from a neighboring cell, is schematically represented by a single rectangular. The unit cells arranged in a plurality of matrices are referred to as an array.

According to Patent Documents 1 and 3, however, a device region in the end area of the array is increased to correspondingly increase a chip size. Similarly, in Patent Document 2, the dummy region is required to be provided in the end area of the array, which prevents a chip-size reduction from being achieved.

SUMMARY OF THE INVENTION

In view of the above-described problems, the present invention has an object of providing a semiconductor integrated circuit including an array of a plurality of unit cells, each including a transistor and a device isolation, and a device isolation surrounding the array. The shape of a predetermined transistor in each of the unit cells situated close to the device isolation is adjusted according to a stress applied by the device isolation (STI) to reduce a variation in transistor performance of the whole array.

More preferably, a channel length or a channel width of each of the predetermined transistors is adjusted in a direction which allows the performance of a P-channel transistor to be decreased and the performance of an N-channel transistor to be enhanced.

Furthermore, for a transistor situated at the corner of the array, the amount of adjustment is more increased as compared with that for the other outermost transistors.

As described above, even if the stress by the STI varies the characteristic of each of the transistors in the individual unit cell, the shape of each of the transistors is optimized in each of the transistors according to the stress applied by the STI. Therefore, an electrical characteristic of the transistors does not vary as the whole array.

As described above, according to the present invention, a variation in transistor between unit blocks arranged in an array, each having the same layout pattern, can be suppressed.

In addition, a chip area can be reduced without increasing a distance from the STI to an active region nor providing a dummy region.

DESCRIPTION OF THE PREFERRED EMBODIMENTS

In order to further clarify the above and other objects, features, and effects of the present invention, embodiments of the present invention will be described in detail referring to the accompanying drawings.

FIGS. 1 to 5 are diagrams illustrating a semiconductor memory device according to a first embodiment of the present invention.

Figure 1:
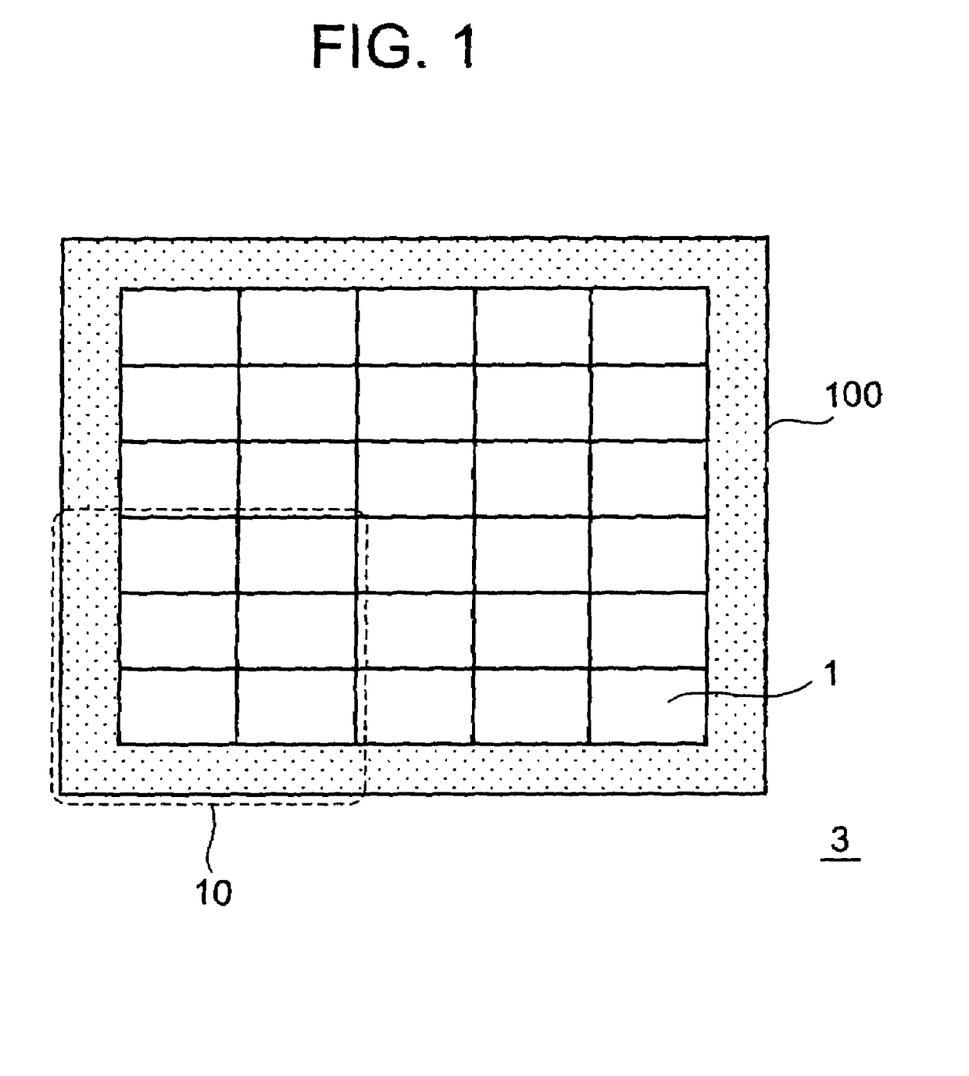
FIG. 1 is a diagram illustrating a memory array according to a first embodiment of the present invention.

FIG. 1 illustrates a whole array structure including five unit cells arranged in an X-direction and six unit cells arranged in a Y-direction, i.e., thirty cells in total, according to the first embodiment. In this embodiment, six transistors constitute the unit cell.

Figure 2:
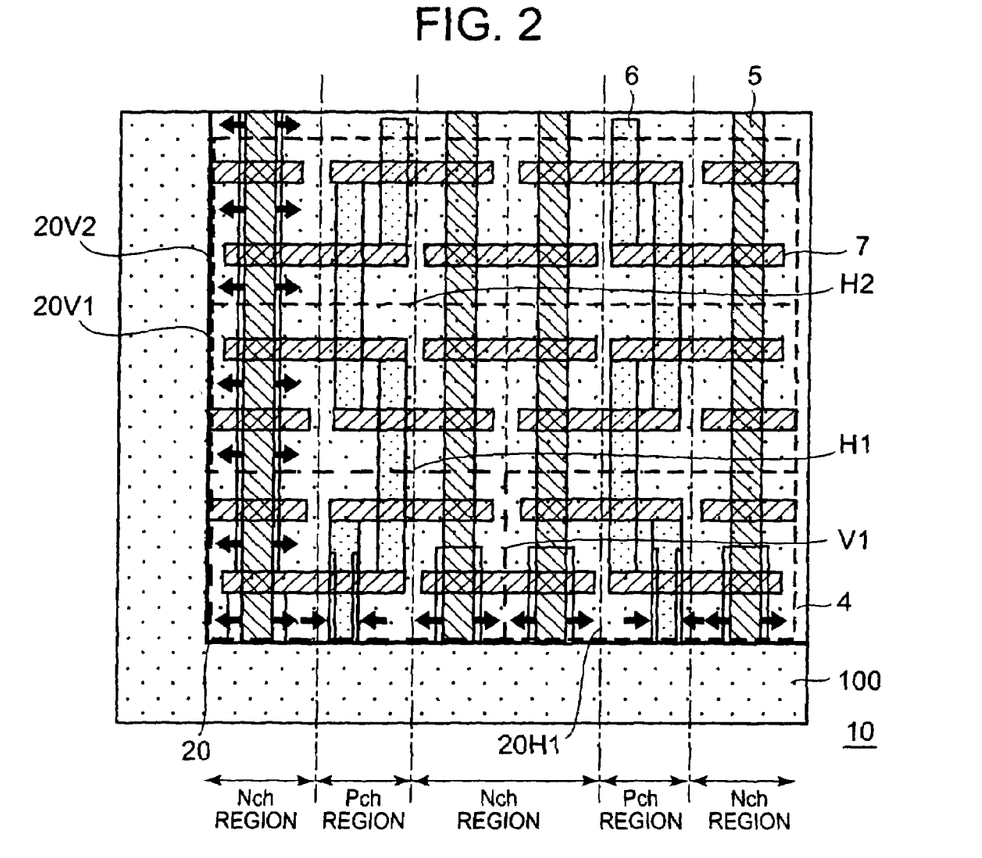
FIG. 2 is a diagram illustrating the details of the memory array according to the first embodiment of the present invention.

For a further detailed description, FIG. 2 illustrates a set 10 of 2×3 unit cells including the unit cell at the corner in an enlarged manner. A PMOS region including a P-diffusion region 6 and an NMOS region including an N-diffusion region 5 are formed. The PMOS region and the NMOS region are distinguished from each other by a chain line in FIG. 2. Between the PMOS region and the NMOS region, an STI (device isolation area) 4 is formed. A gate 7 of each of the PMOS region and the NMOS region is provided to perpendicularly cross each of the P-diffusion region 6 and the N-diffusion region 5. Among the outermost unit cells, the unit cell at the corner is denoted by 20. The unit cells situated above the unit cell 20 in a vertical direction are defined as 20V1 and 20V2, whereas the unit cell situated beside the unit cell 20 in a horizontal direction is defined as 20H1. In this embodiment, a cell which is line-symmetrical to the cell 20 about an edge V1 on the right side illustrated in FIG. 2 is the cell 20H1. A cell which is line-symmetrical to the cell 20 about an edge H1 on the upper side is 20V1. Furthermore, a cell which is line-symmetrical to the cell 20V1 about an edge H2 on the upper side is 20V2. However, the arrangement of the unit cells is not limited thereto. The unit cell is repeated in various manners, for example, in a point-symmetrical manner in some cases.

As can be seen from FIG. 2, in this embodiment, a channel width of a predetermined transistor in each of the outermost cells, which is strongly affected by a stress from the STI is increased in the case of an N-channel transistor and is decreased in the case of a P-channel transistor in a direction indicated by a pair of arrows. The channel width of an N-channel transistor at the corner, which is believed to be the most strongly affected by the stress from the STI, is increased to be further longer than that of the N-channel transistor at the lower left corner in the cell 20H1 situated beside or the cell 20V1 situated above.

Figure 3:
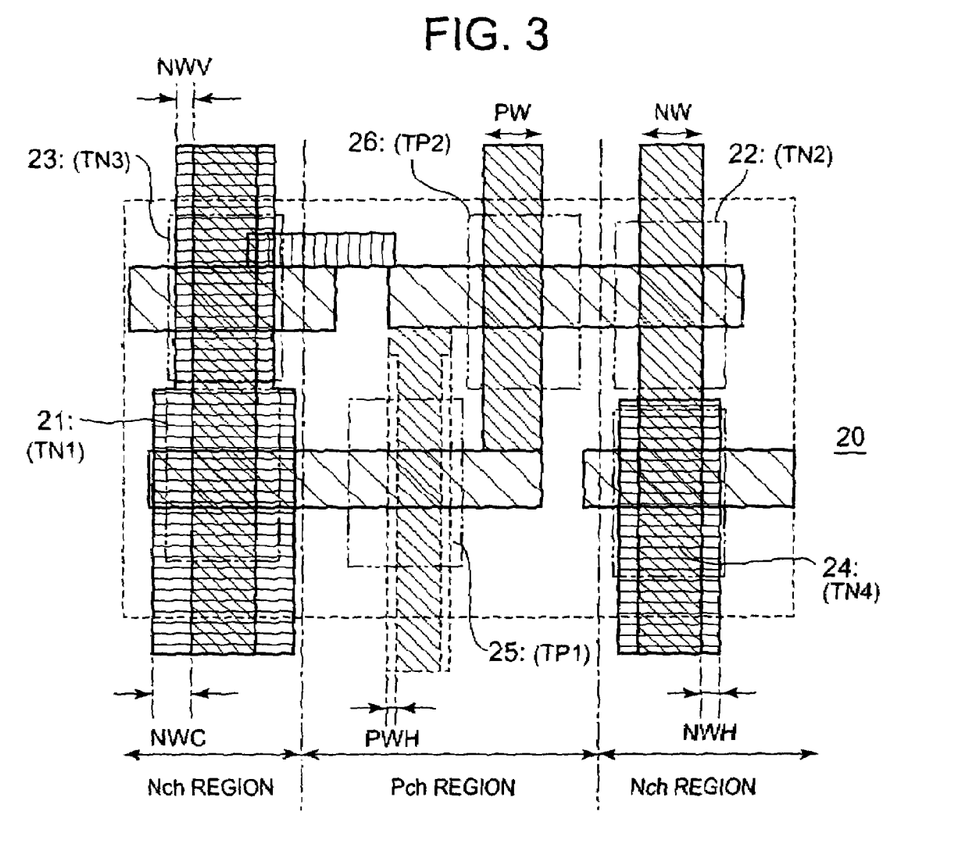
FIG. 3 is a diagram illustrating a lower layer in a unit cell according to the first embodiment of the present invention.

For a more specific description of this first embodiment, a structure of the unit cell 20, specifically, an SRAM cell including six transistors, will be described referring to FIG. 3. In FIG. 3, the unit cell 20 includes four N-channel transistors 21 (TN1) through 24 (TN4) and two P-channel transistors 25 (TP1) and 26 (TP2), each being surrounded by a chain double-dashed line, i.e., six transistors in total. As compared with a general channel width of the N-channel transistor (denoted by NW in FIG. 3), a channel width of the outermost transistor TN3 is increased by 2×NWV, whereas a channel width of the outermost transistor TN4 is increased by 2×NWH. Since FIG. 3 illustrates the unit cell 20 at the corner, a channel width of the N-channel transistor TN1 at the corner is increased by 2×NWC, which is further larger than 2×NWV and 2×NWH for the N-channel transistors TN3 and TN4. On the other hand, a channel width of the PMOS transistor TP1 is reduced by 2×PWV as compared with a general channel width of the P-channel transistor (denoted by PW in FIG. 3). A difference (TP1−TP2) is opposite in sign to a difference (TN4−TN2) in a channel width.

Although the channel width of each of the transistors TN2 and TP2 is not changed in this embodiment, it is likely that even the channel widths of the transistors TN2 and TP2 must be changed according to the stress from the STI. The resizing of the transistors TN1, TN3 and TN4 is as described above. Even for the relationship between transistors TN3 and TN4, however, the transistor TN3 is stressed by the STI from left in the gate width direction in FIG. 3, whereas the transistor TN4 is stressed by the STI from below in the gate length direction in FIG. 3. Therefore, the resizing of the transistors TN3 and TN4 according to a difference in the direction of the applied stress is well conceivable.

Figure 4:
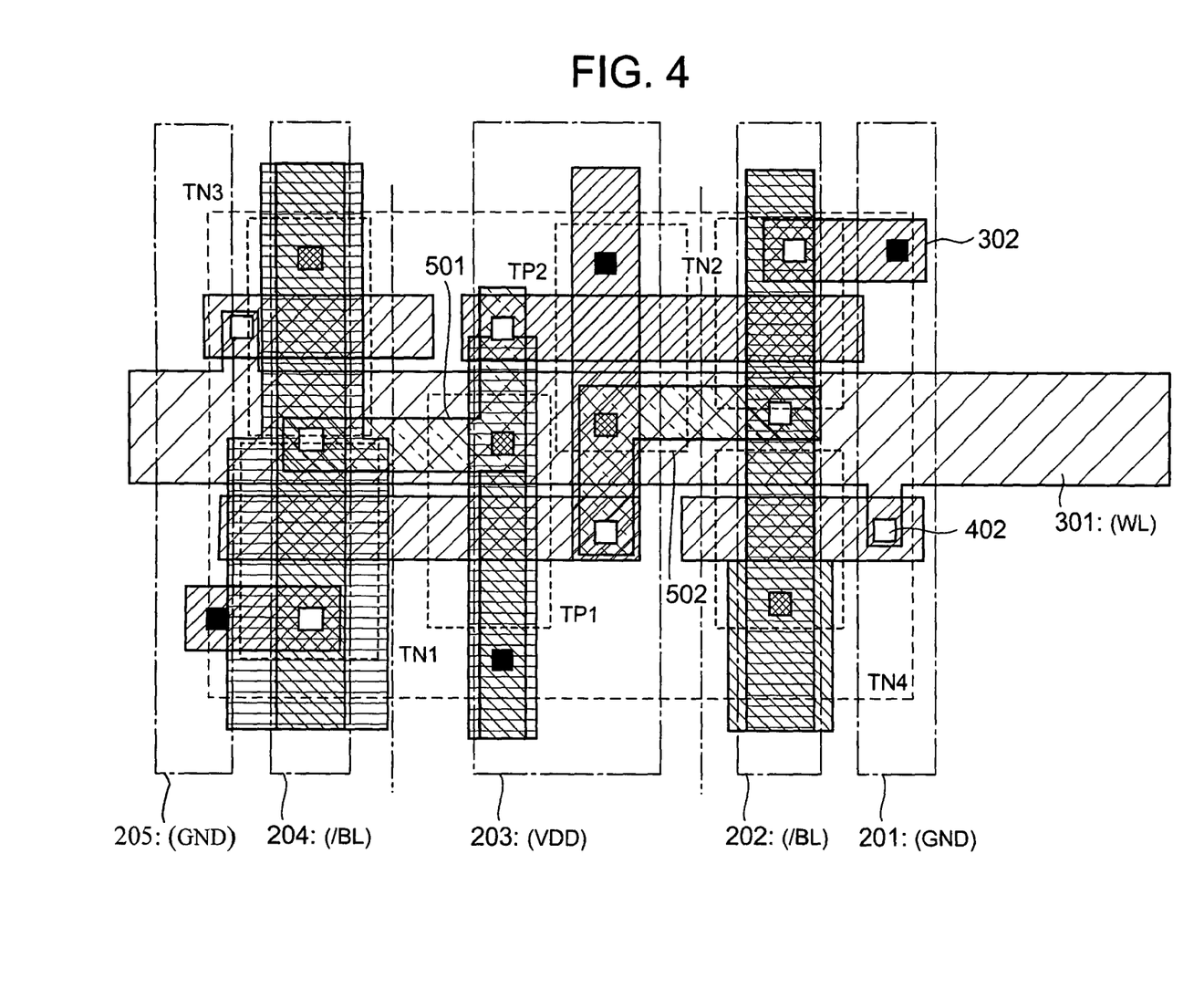
FIG. 4 is a diagram illustrating an upper layer in the unit cell according to the first embodiment of the present invention.
Figure 5:
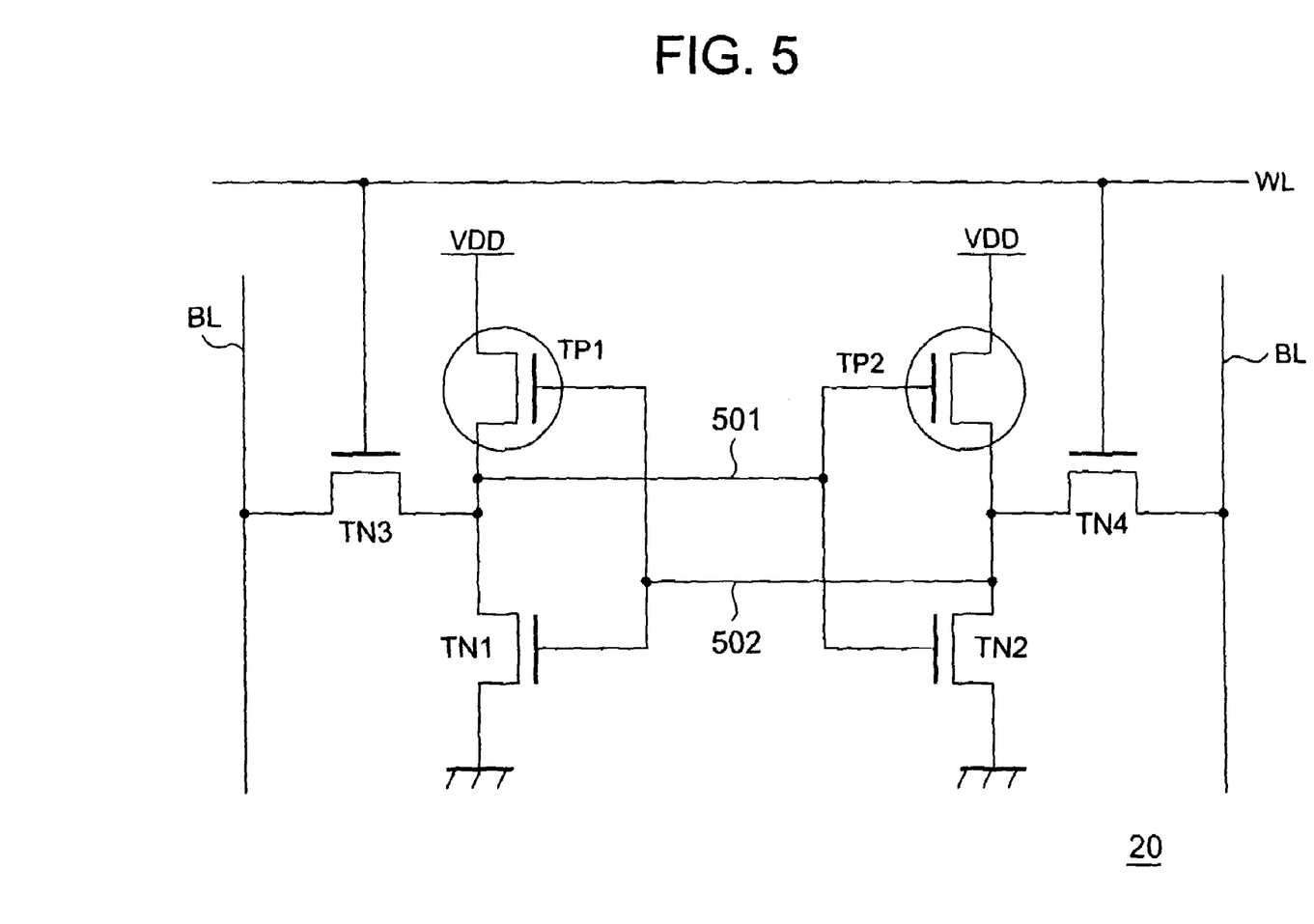
FIG. 5 is a circuit diagram illustrating the unit cell according to the first embodiment of the present invention.

A final form of the unit cell according to this embodiment will be briefly described as a supplemental explanation, referring to FIGS. 4 and 5. FIG. 4 illustrates an upper layer of the unit cell having the layout of the lower layer (the STIs, the P- and N-diffusion regions, and the gates) as illustrated in FIG. 3. First, a connection relation will be described based on the transistor TN1 referred to as a driving transistor. A GND potential is supplied to a source of the transistor TN1 from a GND wiring 205 corresponding to a first wiring layer through an intermediate wiring 302 corresponding to a second wiring layer situated below the GND wiring 205. The transistor TN1 shares a gate with the P-channel transistor TP1. An input from a cross-node wiring 502 corresponding to a third wiring layer, which is an output line of the transistors TP2 and TN2, is input to the gate. A drain of the transistor TN1 is connected to the transistor TN3 in the N-diffusion region, and is further connected to a gate shared by the transistors TP2 and TN2 through a third layer wiring 501. Next, the transistor TN3 is connected to the transistor TN1 in the diffusion region. The diffusion region on the opposite side of the gate is connected to a bit line 204 (BL). This transistor TN3 is referred to as a transfer transistor. Now, the transistor TP1, referred to as a load transistor, will be described. A power supply voltage VDD is supplied through a first wiring layer 203 to a source of the transistor TP1. The transistor TP1 shares a gate with the transistor TN1. Since a drain of the transistor TP1 is connected to a drain of the transistor TN1, the destinations of the drains of the transistors TP1 and TN1 are the same. The transistors TN2, TN4 and TP2 are formed symmetrically to the above-described transistors TN1, TN3 and TP1. Finally, an SRAM cell including six transistors illustrated in a circuit diagram of FIG. 5 is completed.

Figure 6:
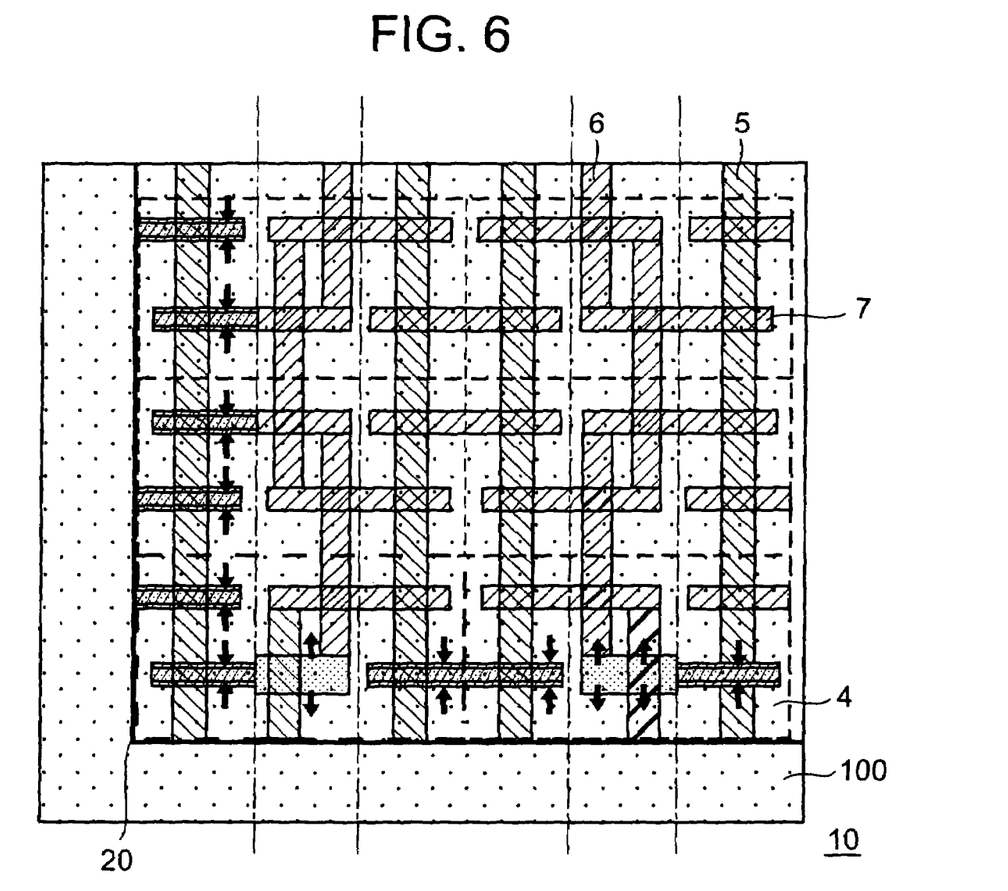
FIG. 6 is a diagram illustrating a memory array according to a second embodiment of the present invention.
Figure 7:
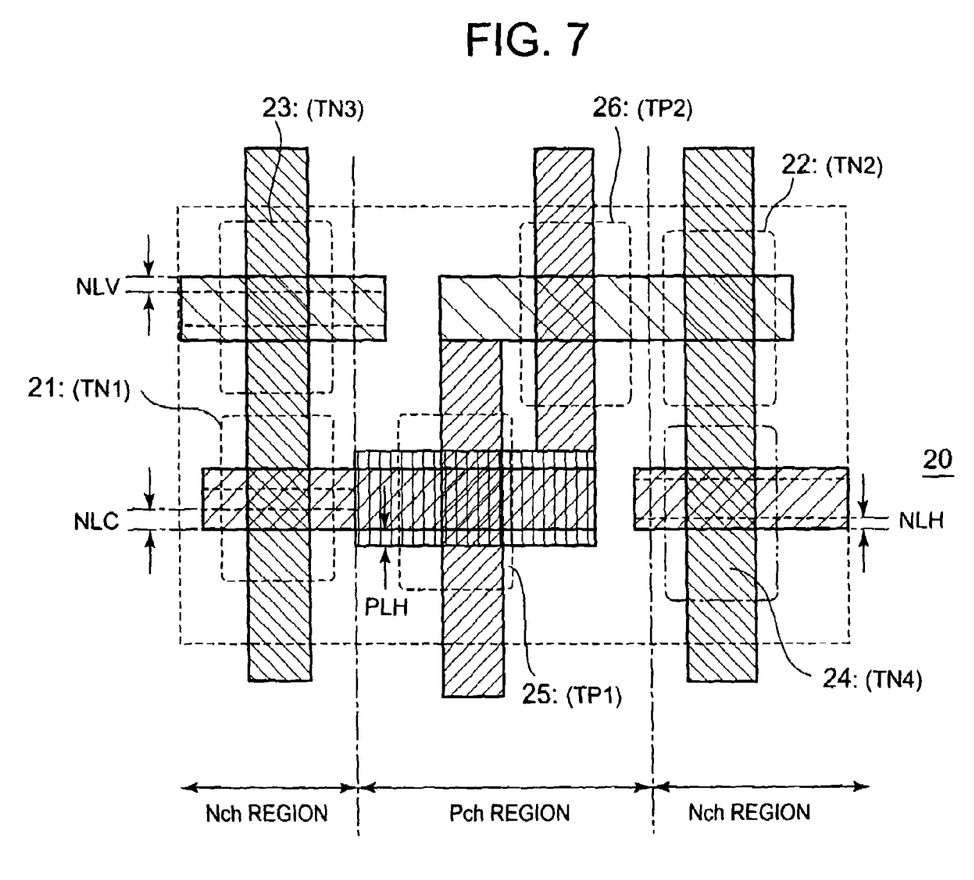
FIG. 7 is a diagram illustrating a lower layer in a unit cell according to the second embodiment of the present invention.

FIGS. 6 and 7 illustrate a semiconductor memory device according to a second embodiment of the present invention.

FIG. 6 illustrates a set of 2×3 unit cells 10 including a unit cell at the corner, as in the case of FIG. 2 in the first embodiment. The channel width of a predetermined transistor in the outermost unit cell is changed according to the stress from the STI in the first embodiment, whereas a channel length of the predetermined transistor is changed in this second embodiment.

A more specific description will be given referring to FIG. 7 illustrating the corner cell shown in FIG. 6 in an enlarged manner. Since FIG. 7 illustrates the same structure as that shown in FIG. 3 in the first embodiment, the overlapping description will be herein omitted. As compared with a general channel length of an N-channel transistor (denoted by NL in FIG. 7), a channel length of an outermost transistor TN3 is reduced by 2×NLV, whereas a channel length of an outermost transistor TN4 is reduced by 2×NLH. Moreover, a channel length of the transistor TN1 at the corner is reduced by 2×NLC, which makes the channel length of the transistor TN1 further shorter than that of the transistors TN3 and TN4. On the other hand, a channel length of the PMOS transistor TP1 is increased by 2×PWH as compared with a general channel length of a P-channel transistor (denoted by PL in FIG. 7). A difference (TP1−TP2) is opposite in sign to a difference (TN4−TN2) in a channel length.

Although the channel lengths of the transistors TN2 and TP2 are not changed in this second embodiment as in the case of the first embodiment, it is likely that the channel lengths of the transistors TN2 and TP2 must be changed according to the stress from the STI. The resizing of the transistors TN1, TN3 and TN4 is as described above. Even for the relationship between transistors TN3 and TN4, however, the resizing of the transistors TN3 and TN4 according to a difference in the direction of the applied stress is well conceivable.

It is apparent that the present invention is not limited to the above-described embodiments and each of the embodiments can be appropriately changed within the scope of the technical idea of the present invention. For example, the first and second embodiments can be combined. Specifically, according to the stress from the STI, it is possible to change the channel length of the N-channel transistor and the channel width of the P-channel transistor.

In the embodiments of the present invention, the SRAM cell has been described as an example of the content of the unit cell. However, the content of the unit cell is not limited thereto. A DRAM cell or a non-volatile memory cell may also be used as the content of the unit cell. Furthermore, a logic circuit element such as an inverter, which is repeatedly arranged, or a transistor itself may be used as the content of the unit cell. Specifically, the present invention is applicable to the case where multiple elements (group), each having the same shape and function, are arranged in an array.

Therefore, although the element at the corner, which is the most strongly affected by the STI, is the N-channel transistor in the embodiments of the present invention, the element at the corner is not limited thereto. It is apparent that the element at the corner may also be the P-channel transistor.

What is claimed is:

1. A semiconductor integrated circuit, comprising:
an array of a plurality of unit cells, each of said unit cells having a same size; and
a device isolation surrounding the array,
wherein one of said unit cells in a vicinity of the device isolation has a transistor of a different physical characteristic and substantially a same electrical characteristic as compared with another transistor in another of said unit cells provided away from the device isolation, and
wherein said one transistor has a smaller channel width than that of said another transistor.

2. A semiconductor integrated circuit according to claim 1, wherein the physical characteristic is one of a gate width and a gate length of the transistor.

3. A semiconductor integrated circuit according to claim 1, wherein the unit cell includes a flip-flop circuit.

4. A semiconductor integrated circuit according to claim 1, wherein the unit cell includes an SRAM cell.

5. A semiconductor integrated circuit according to claim 1, wherein each of the unit cells in the array is electrically activated in response to a respective control signal.

6. A semiconductor integrated circuit according to claim 1, wherein the one transistor comprises an N-type MOS transistor and said another transistor comprises another N-type MOS transistor, said one and another transistors having corresponding functions in respective unit cells, said one transistor having a larger channel width than said another N-type MOS transistor.

7. A semiconductor integrated circuit according to claim 1, wherein the one transistor comprises a N-type MOS transistor and said another transistor comprises another N-type MOS transistor, said one and another transistors having corresponding functions in respective unit cells, said one transistor having a shorter channel length than said another N-type MOS transistor.

8. A semiconductor integrated circuit according to claim 1, wherein the one transistor comprises a P-type MOS transistor and said another transistor comprises another P-type MOS transistor, said one and another transistors having corresponding functions in respective unit cells, said one transistor having a longer channel length than said another P-type MOS transistor.

9. A semiconductor integrated circuit, comprising:
an array of a plurality of unit cells, each of said unit cells having a same size; and
a device isolation surrounding the array,
wherein one of said unit cells in a vicinity of the device isolation has a transistor of a different physical characteristic and substantially a same electrical characteristic as compared with another transistor in another of said unit cells provided away from the device isolation, and
wherein the one transistor comprises a P-type MOS transistor and said another transistor comprises another P-type MOS transistor, said one and another transistors having corresponding functions in respective unit cells, said one transistor having a smaller channel width than that of said another P-type MOS transistor.

10. A semiconductor integrated circuit according to claim 9, wherein said one unit cell is located in the vicinity of the device isolation and away from a corner of the device isolation,
wherein said circuit includes yet another unit cell located in a vicinity of said corner and having yet another transistor, and
wherein the P-type MOS transistor has a smaller channel width than that of the one transistor.

11. A semiconductor integrated circuit, comprising:
an array of a plurality of unit cells, each of said unit cells having a same size; and
a device isolation surrounding the array,
wherein one of said unit cells in a vicinity of the device isolation has a transistor of a different physical characteristic and substantially a same electrical characteristic as compared with another transistor in another of said unit cells provided away from the device isolation,
wherein the one transistor comprises an N-type MOS transistor and said another transistor comprises another N-type MOS transistor, said one and another transistors having corresponding functions in respective unit cells, said one transistor having a larger channel width than said another N-type MOS transistor,
wherein said one unit cell is located in the vicinity of the device isolation and away from a corner of the device isolation,
wherein said circuit includes yet another unit cell located in a vicinity of said corner and having yet another transistor, and
wherein the N-type MOS transistor has a larger channel width than that of the one transistor.

12. A semiconductor integrated circuit, comprising:
an array of a plurality of unit cells, each of said unit cells having a same size; and a device isolation surrounding the array, wherein one of said unit cells in a vicinity of the device isolation has a transistor of a different physical characteristic and substantially a same electrical characteristic as compared with another transistor in another of said unit cells provided away from the device isolation, wherein the one transistor comprises a N-type MOS transistor and said another transistor comprises another N-type MOS transistor, said one and another transistors having corresponding functions in respective unit cells, said one transistor having a shorter channel length than said another N-type MOS transistor, wherein said one unit cell is located in the vicinity of the device isolation and away from a corner of the device isolation, wherein said circuit includes yet another unit cell located in a vicinity of said corner and having yet another transistor, and wherein the N-type MOS transistor has a shorter channel length than that of the one transistor.

13. A semiconductor integrated circuit, comprising:

an array of a plurality of unit cells, each of said unit cells having a same size; and a device isolation surrounding the array, wherein one of said unit cells in a vicinity of the device isolation on has a transistor of a different physical characteristic and substantially a same electrical characteristic as compared with another transistor in another of said unit cells provided away from the device isolation, wherein the one transistor comprises a P-type MOS transistor and said another transistor comprises another P-type MOS transistor, said one and another transistors having corresponding functions in respective unit cells, said one transistor having a longer channel length than said another P-type MOS transistor, wherein said one unit cell is located in the vicinity of the device isolation and away from a corner of the device isolation, wherein said circuit includes yet another unit cell located in a vicinity of said corner and having yet another transistor, and wherein the P-type MOS transistor has a longer channel length than that of the one transistor.

14. A semiconductor integrated circuit, comprising:

an array of a plurality of unit cells; and a device isolation surrounding the array, wherein one of said unit cells in a vicinity of the device isolation has a transistor of a different physical characteristic and substantially the same electrical characteristic as compared with another transistor in another of said unit cells provided away from the device isolation, and wherein the one transistor comprises a P-type MOS transistor and said another transistor comprises another P-type MOS transistor, said one and another transistors having corresponding functions in respective unit cells, said one transistor having a smaller channel width than that of said another P-type MOS transistor.

15. A semiconductor integrated circuit, comprising:

an array including a plurality of unit cells, each of said unit cells having a same size, said unit cell including one of a P-type and an N-type MOS transistor, and an STI adjacent to the transistor; and a peripheral area comprising of an STI surrounding the array, wherein a size of a predetermined transistor in a unit cell in a vicinity of the peripheral area is set according to a stress from the peripheral area to allow the predetermined transistor to have an equivalent characteristic to that of a transistor having the same function as that of the predetermined transistor in a unit cell other than the unit cell in the vicinity of the peripheral area, and wherein said predetermined transistor has a smaller channel width than that of said transistor.

16. A semiconductor integrated circuit comprising:

an array including a plurality of unit cells, each of said unit cells having a same size, said unit cell including one of a P-type and N-type MOS transistor, and an STI adjacent to the transistor; and a peripheral area comprising of an STI surrounding the array, wherein a size of a predetermined transistor in a unit cell in a vicinity of the peripheral area is set according to a stress from the peripheral area to allow the predetermined transistor to have an equivalent characteristic to that of a transistor having the same function as that of the predetermined transistor in a unit cell other than the unit cell in the vicinity of the peripheral area, and wherein the predetermined transistor comprises a P-type MOS transistor and said transistor comprises another P-type MOS transistor, said predetermined transistor and said transistor having corresponding functions in respective unit cells, said predetermined transistor having a smaller channel width than that of said another P-type MOS transistor.

* * * * *